United States Patent [19]

Calhoun

[11] 3,795,974

[45] Mar. 12, 1974

[54] REPAIRABLE MULTI-LEVEL LARGE SCALE INTEGRATED CIRCUIT

[75] Inventor: Donald F. Calhoun, Inglewood, Calif.

[73] Assignee: Hughes Aircraft Company, Culver City, Calif.

[22] Filed: Dec. 16, 1971

[21] Appl. No.: 208,969

Related U.S. Application Data

[62] Division of Ser. No. 16,869, March 5, 1970, abandoned.

[52] U.S. Cl......................... 29/574, 29/577, 29/578

[51] Int. Cl............................................. B01j 17/00

[58] Field of Search...................... 29/577, 574, 578

[56] References Cited

FOREIGN PATENTS OR APPLICATIONS 1,117,579 6/1967 Great Britain................. 317/101 A

*Primary Examiner*—Charles W. Lanham
*Assistant Examiner*—W. C. Tupman
*Attorney, Agent, or Firm*—W. H. MacAllister

[57] ABSTRACT

A multi-level complex standard circuit comprising a wafer having a plurality of cells in a rectilinear array and alternate layers of dielectric insulation and metalization formed in a laminae on top of the wafer. Vias in the first layer insulation expose the pads of N + K (where N and K are integers) desired usable cells in a first layer of metalization on the wafer. The pads are electrically connected through the vias to a second layer of metalization which is formed into individual conductors. The conductors are routed for effectively relocating the exposed pads of selected usable cells to desired positions defined by master pattern circuit locations including those usable cells whose actual positions are not in registry with the desired positions defined by master pattern circuit locations. The second layer of metallization and further includes "feed-under" conductor segments formed over specified non-used locations. A second layer of insulation has vias at standard or master pattern cell locations which expose the master pattern pads of the N + K cells to a top layer of metalization that includes a standard master pattern of interconnect lines which interconnect N of the cells into a functional circuit. The master pattern of metalization further includes pads associated with K extra cells which are located at scandard or master pattern cell locations. The extra cells can be utilized to replace faulty ones of the N interconnected cells by disabling, in the top layer of metalization, the interconnect lines associated with each faulty one of the N cells and connecting one of the extra cells to the disabled interconnect lines.

9 Claims, 8 Drawing Figures

INVENTOR.
DONALD F. CALHOUN,
BY
Robert Thompson
ATTORNEY.

REPAIRABLE MULTI-LEVEL LARGE SCALE INTEGRATED CIRCUIT

This is a division of application Ser. No. 16,869 filed Mar. 5, 1970, and now abandoned.

BACKGROUND OF THE INVENTION

This invention relates generally to repairable complex integrated circuits and relates more particularly to means and methods for repairing multi-level large scale integrated circuits at a master pattern top level of metalization.

In integrated circuit technology, wafers having a non-uniform yield of good cells have heretofore been interconnected into functional circuit types by producing a plurality of masks tailored for that particular wafer yield distribution, each mask being associated with an associated individual alternate layer of dielectrical insulation or metalization. A first one of these masks was utilized during fabrication to define and form feed-throughs or vias exposing the pads of selected good cells at the first layer of metalization on the wafer to a second layer of metalization. A second mask was utilized to form the second layer of metalization into conductors associated with the vias in the first layer of insulation and routed to vias which were subsequently formed in a second layer of insulation by a third mask. At least one and possibly more layers of metalization were formed on top of the second layer of insulation and fabricated into interconnect lines and cross-overs as defined by at least a fourth mask and possibly more masks whereupon all of the selected usable cells were electrically interconnected into a functionally specified complex integrated circuit.

In addition to the signal connection pads of the interconnected cells, a certain number of extra cells were routed by means of a vias and short lines to otherwise unused and available areas in the top layer of metalization of that wafer.

After diagnostic testing of the functional characteristics of the interconnected cells, the number of faulty or failed cells was noted and their interconnect lines located, and severed, or otherwise disabled. Since the routing and location of interconnect lines varied from wafer to wafer, they were somewhat difficult to locate on a wafer-to-wafer basis. In addition, not all of the signal interconnect lines were brought to the top layer of metalization. Thus, it was difficult to isolate the fault. Furthermore, it was difficult to sever or otherwise disable the interconnect lines since it is difficult to remove dielectric insulation between the second and third layer of metalization. If, after the interconnect lines were located and severed, the signal connects of the corresponding number of extra usable cells were located and connected to the appropriate signal connects associated with the severed interconnect lines so as to exactly replace the faulty circuit with a good circuit function.

SUMMARY OF THE INVENTION

Objects, features, and advantages of this invention can be attained with the provision of an integrated circuit wafer having an imperfect yield distribution of usable cells and alternate layers of dielectrical insulation and metalization formed on top of the wafer in laminae. These alternate layers of insulation and metalization form electrical conductor means for effectively routing signal connects or pads of N + K usable cells (where N and K are integers, to N + K desired positions defined by master pattern circuit locations. Thereafter, the signal connects associated with N of these cells at sites within the desired positions defined by the master pattern circuit locations are all fed to and interconnected in a top layer of metalization, by means of interconnect conductors formed in a standard pattern, into a functional specified circuit part type.

The top layer of metalization is also featured by signal connects associated with the K extra good cells which are effectively routed to standard or otherwise unused positions in the top layer of metalization by means of vias and, if necessary, pad relocation conductors routed from the signal connects of the selected extra cells in the first layer of metalization to signal connects in the top layer of metalization.

Advantages of this circuit are that: all interconnect lines associated with the N cells and the signal connects associated with the K extra cells are all formed in fixed desired positions according to a master pattern at the second layer of metalization for the same part type thus allowing standard replacement procedures to be defined; all used signal connects associated with the N + K cells are routed to the top level of metalization before any signal interconnect is accomplished, thus allowing complete circuit replacement by disabling fixed interconnect lines in the top level of metalization only; standardization and routing of all signals to the top level make possible engineering compromises of relaxing first level circuit test criteria or making more stringent a final a.c. test criteria or using more complex cells or larger arrays; and eliminating the low-yield rework steps of repairing metalization below the top level improves the overall production yield.

BRIEF DESCRIPTION OF THE DRAWINGS

Other objectives, features and advantages of this invention will become apparent upon reading the following detailed description and referring to the accompanying drawings wherein.

Figure 4:
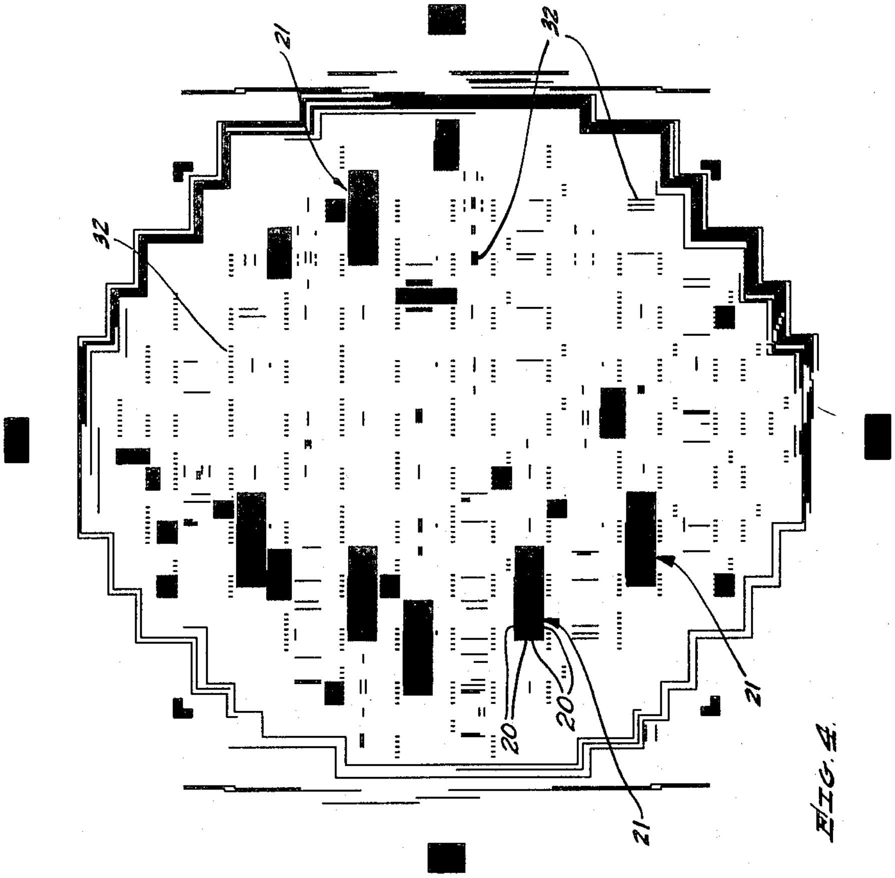
Figure 5:
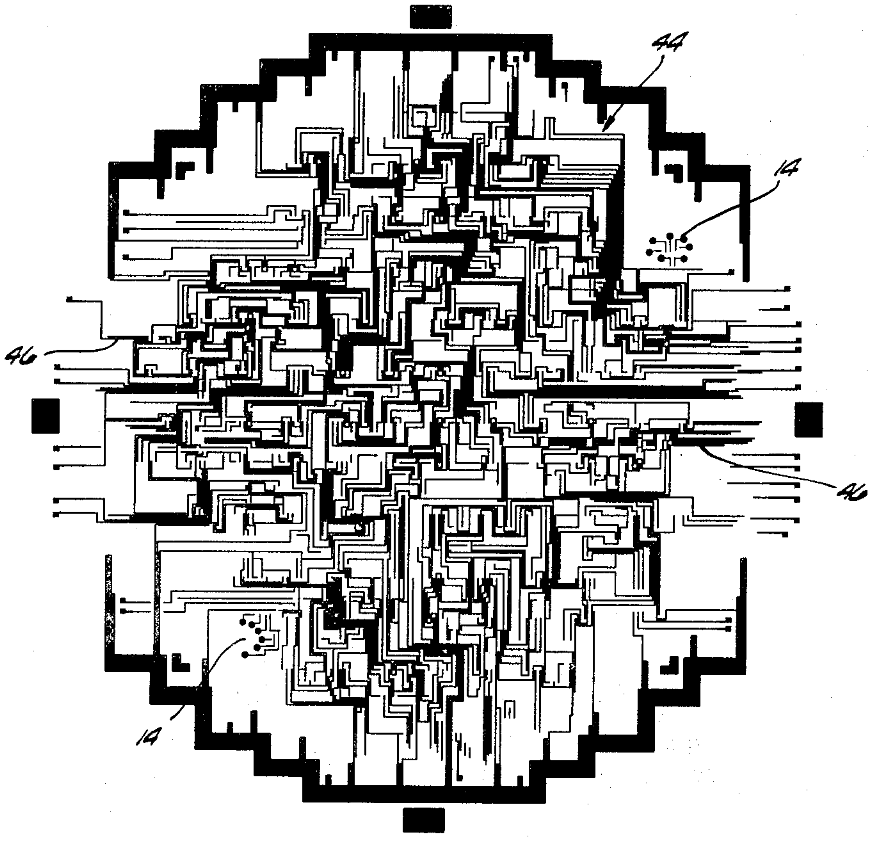
Figure 6:
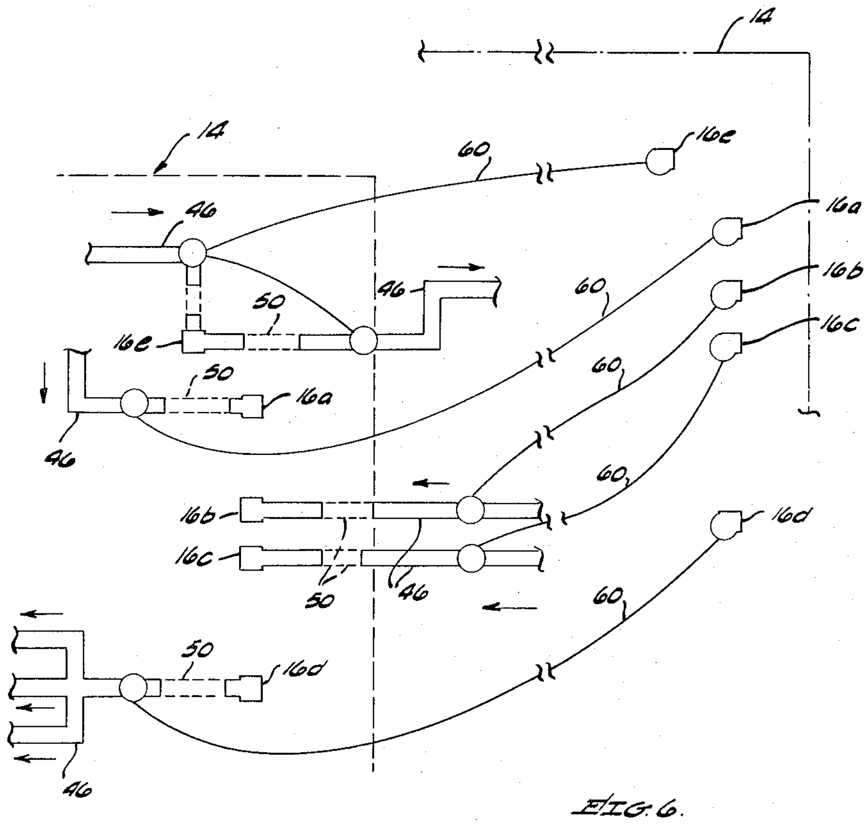

FIG. *2a* is an enlarged top plan view schematically illustrating exemplary pad locations in the first layer of metalization of an integrated circuit cell;

FIG. *2b* is an enlarged schematic illustration of a portion of a mask of the type associated with the vias in a layer of insulation to expose the pads of an integrated circuit cell;

FIG. *3a* is an enlarged cross-sectional side elevational view, not to scale, illustrating the relationship between the integrated circuit cell, vias in a first layer of dielectric insulation, pad relocation lines in a second layer of metalization, standard positioned vias in a second layer insulation, and standard positioned interconnect lines in a third layer of metalization;

FIG. *3b* is an enlarged cross-sectional side elevational view, not to scale, illustrating the relationship of the layers of dielectric insulation and vias between the pads of a usable integrated circuit cell and the standard positioned interconnect line in a third layer of metalization, and in addition illustrates the relationship between the standard positioned vias in the second layer of insulation and cross-unders in the second layer of metalization;

FIG. 4 is a top plan view of the second layer of metalization illustrating pad relocation lines and cross-under conductor line segments formed therein;

FIG. 5 is a top plan view of the third layer of the metalization illustrating the standard pattern of K extra cells or circuits and interconnect lines which are selectively connected to the exposed pads of N usable integrated circuit cells at standard positioned circuit locations, and to cross-unders in the second layer of the metalization through the standard positioned vias; and FIG. 6 is a schematic illustrating an isolated faulty cell, a replacement cell and jumpers connected between the corresponding pads of the two cells.

DESCRIPTION OF A PREFERRED EMBODIMENT

Figure 1:
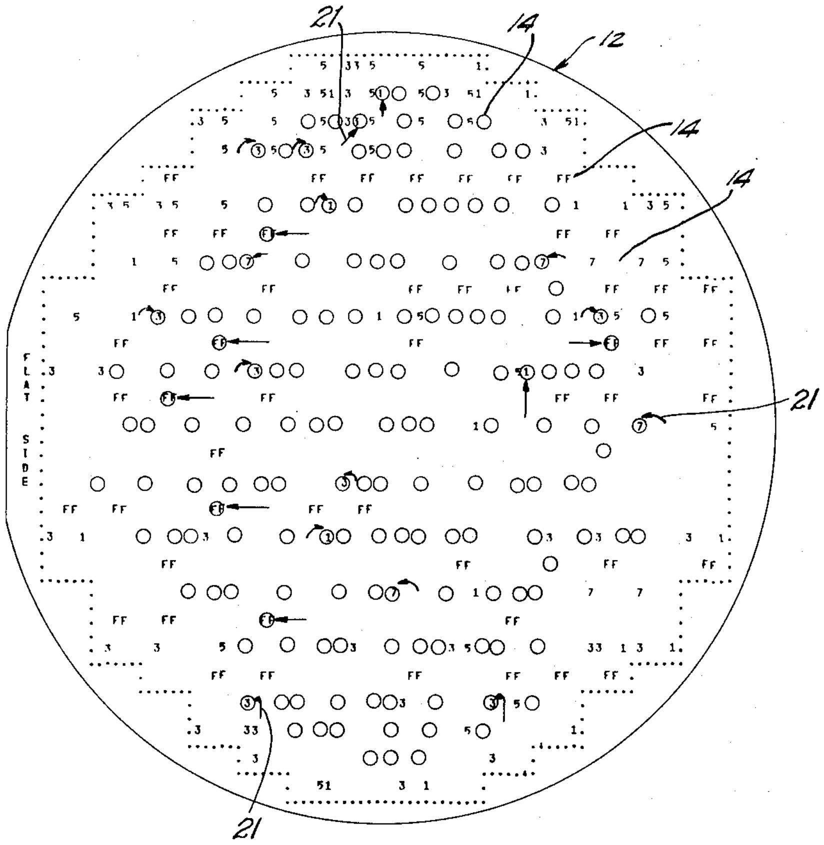
FIG. 1 is a schematic graphical illustration of the yield distribution of usable cells relative to a master pattern of cell locations wherein selected usable cells are relocated to desired positions defined by master pattern cell locations as illustrated schematically by the line having an arrowhead.

Referring now to the drawings in more detail, FIG. 1 illustrates an integrated circuit wafer 12 having a predominantly circular periphery except for one portion thereof which is formed as a straight edge so that the integrated circuit wafer can be properly oriented. The integrated circuit wafer 12 is further divided into a plurality of individual integrated circuit cells or circuits 14 which are generally rectangular and, in the embodiment illustrated, arranged in a rectilinear array. Each one of these cells can, for example, be 0.060 inch by 0.060 inch and is electrically separated from the adjacent cells by a border of electrically isolating material. The cell itself can include a plurality of active circuit elements such as semiconductor diodes and transistors and passive elements such as conductors, resistors, and capacitors. These elements are coupled together by metalization in the wafer 12 into a predetermined circuit configuration so that when electrical signals are applied to signal connects of the cells, it will operate in a predetermined manner.

Figure 2A:
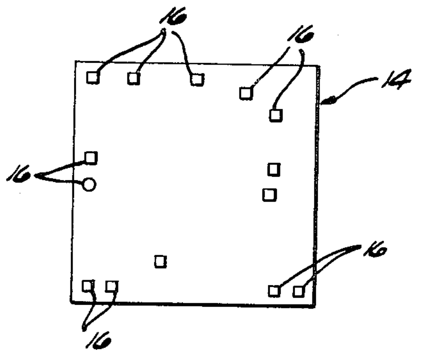

In order to facilitate signal connections with the individual cells 14, each cell includes a plurality of signal connect members or pads 16 (see FIG. 2) located at termination ends of signal lines in the first layer of metalization associated with the surface of the cell. These pads 16 usually have a somewhat larger dimension and area than the signal line widths which they are associated with. For example, the pads 16 can have a dimension of 0.003 inch × 0.003 inch whereas the associated conductor may only be 0.001 inch wide. There can, for example, be fourteen or possibly more or fewer of these pads 16 associated with each cell. The active and passive elements of each cell are usually arranged internally of the cell 14 so that electrical signals can be applied to some of the pads 16 whereupon a portion of the integrated circuit components can be used as a gate, flip-flop, or other circuit element; or else input or output lines can be coupled to all of the pads of a cell so that that cell operates as a complete logic circuit. Hereinafter when the term "cell" is used, it should be understood that this is intended to cover both the entire cell or any functional portion thereof. Furthermore, in those instances where the term "usable cells" is used, it is intended to be synonymous with the term "good cells" or any portion thereof.

The yield of usable cells to total cells on the wafer 12 has heretofore been less than 100 percent. For example, the yield typically can be between 20 and 80 percent and possibly more. With such yield there is no discernible pattern to the specific locations of usable cells 14 and unusable cells 14 since they are located unpredictably across the array even though there is a tendency for good cells 14 to be predominantly located toward the center of the wafer 12.

In order to determine which of the cells 14 is usable or good, they are generally tested electrically so that the good cells can be determined and properly identified. Generally, a d.c. electrical test is made of each circuit to obtain adequate identification of the good circuit. In addition, further a.c. electrical testing of the good cells can be performed for added confidence of the operational capabilities of the circuit.

After electrical testing of the cells 14 has been completed, it is usually determined that the unusable cells occur in an unpredictable pattern as exemplified by the symbols 1, 3, 5, 7 and "FF" located within the rectangular integrated circuit cells 14 of FIG. 1. In this particular example: the symbol 1 is representative of a defective one input NAND gate; the symbol 3 is representative of a defective three input NAND gate; the symbol 5 is representative of a defective five input NAND gate; the symbol 7 is representative of a defective seven input NAND gate; and the symbol "FF" is representative of a defective flip-flop. Those cells that do not have one of the above identified symbols located therein are representative of a good or usable integrated circuit cell 14.

A master pattern or cell locations selected for a five bit sign and magnitude modular multiplier fabricated from a Texas Instrument integrated circuit slice part number K1206 is represented in FIG. 1 by means of a plurality of geometric symbols such as a circle 0. The cell locations on the master pattern define the desired positions of operable cells, regardless of whether or not the actual operable cell positions coincide with the desired positions. Since the desired positions conform to the master pattern cell locations, the desired positions are located in identical locations for all wafers, intended to have the same electrical function, which are to be processed in accordance with the teachings of the present invention.

Where actual good cells 14 exist in general registry with a desired position defined by or coincidence with a master pattern circuit location, they are identified by one of the above identified geometric symbols within one of the otherwise blank rectangular cells 14. When, however, a master pattern cells location defining a desired position does not contain or coexist with the actual position of a good cell, as represented by one of the geometric symbols and one of the symbols 1, 3, 5, 7 or "FF" within the same cell, it is necessary to relocate by conductor line routing the pads 16 of a selected nearby usable cell 14 to sites of pad locations at that desired position defined by its master pattern circuit or cell location in a manner to be described in more detail subsequently with reference to FIG. 4.

Generally, nearby good cells 14 can be relocated to a desired position defined by a master pattern cell location in a second layer of metalization by interconnect lines or electrical conductors 20 (see FIGS. *3a–b* and 4) each routed from an exposed pad 16 of the selected good cell to a site of a corresponding pad location at the desired position defined by the master pattern circuit location but isolated from the latter circuit by a dielectric film. Such routing of the pad relocation lines 20 is illustrated schematically in FIG. 1 by the straight or curved line segments 21 having arrowheads at one end and extending between a selected good cell location and a desired position defined by a master pattern cell location. It should, of course, be understood that each one of the lines 21 with arrowheads is representative of a plurality of individual interconnect lines or conductors 20, each of which is routed from a pad site of a good cell to a pad at the desired position conforming to the master pattern cell location as illustrated in more detail in FIG. 3. It should be understood that a desired position defined by a master pattern cell or circuit location does not have to be congruent with superposed on a wafer cell location.

As a result of the relocation of a selected good cells 14 to the desired position defined by the master pattern cell location where no good cell would otherwise be found, identical positions, defined by a common or master pattern, of N + K (where N and K are integers) good cells is effectively established. This allows standard or standardized pattern masks of vias and interconnect lines to be used to form an additional top layer of master pattern standardized interconnect lines for interconnecting N of the individual cells 14 together into a specific part type, as will be described in more detail with reference to FIG. 5. In addition, signal connects for the K extra cells can be formed at master pattern locations.

Figure 2B:
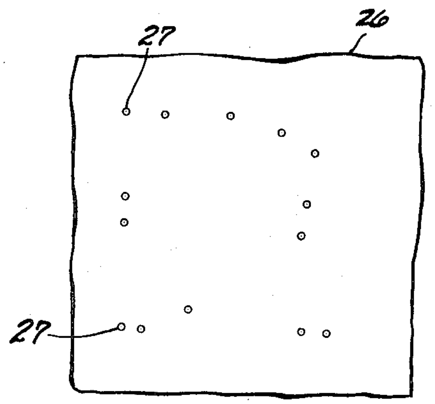
Figure 3A:
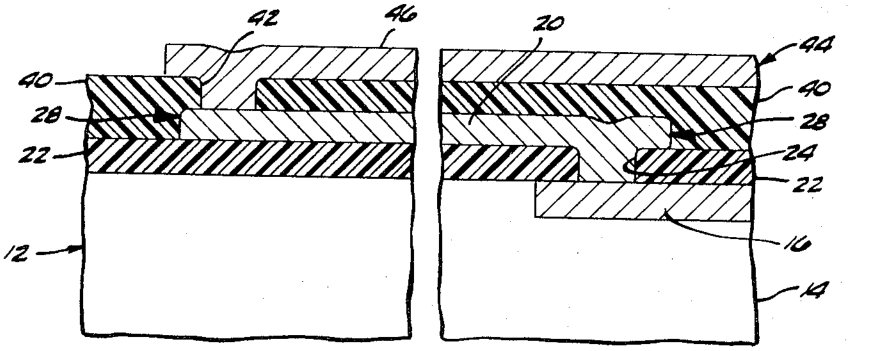

Reference is now made to one such fabrication of a complex integrated circuit, specific processing details of several techniques being described in my copending patent application Ser. No. 206,555, filed Dec. 9, 1971, entitled Integrated Circuit Interconnections, and a division of Ser. No. 762,459, filed on Sept. 25, 1968, now abandoned. As illustrated in FIG. 3*a*, the first layer of metalization integral with the surface of the wafer 12 and containing the pads 16 (FIG. 2*a*) has a layer of dielectric insulation material 22, such as low sodium glass or quartz formed thereon, with vias 24 or feedthroughs processed therethrough in registration with the pads 16 of N + K selected cell 14. These vias 24 are formed in the insulation 22 by a photoprocess utilizing a via mask 26 with vias 27 produced for that particular wafer, a portion of which is shown in FIG. 2*b*. This via mask 26 selectively exposes a layer of photoresist so that a portion of the photoresist remains over the selected pads 16 while the layer of insulation 22 is formed. When the photoresist is subsequently removed, vias 24 are formed through the insulation 22 which expose the pads 16.

It should be understood that the entire mask 26 for vias 24 has not been illustrated in detail in FIG. 2*b* since the scale on patent drawings is too small to adequately illustrate a vias aperture 27 having an actual dimension of 0.001 inch. However, the specific location of vias 24 in the first layer of electrical insulation 22 can be identified and determined by referring to FIGS. 4 and 5 wherein the vias 24 are located at the termination ends of individual conductors in the second layer of metalization that are not coincident with another terminating end of conductors in the other layer of metalization or coincident with a feedunder in the second layer of metalization when the two additional metalization layers of interconnects are superposed over one another.

For purposes of illustration, the enlarged cross sectional view, not to scale, in FIG. 3a schematically illustrates a via 24 extending from a pad 16 in the first layer of metalization on the face of an integrated circuit cell 14 to the second layer of metalization 28 such as, for example, aluminum which contains the pad relocation lines 20 illustrated generally in FIG. 4. As previously mentioned with reference to FIG. 1, these pad relocation lines 20 are each routed from pads 16 of selected usable cells to a desired position as defined by a master pattern circuit location. These desired positions defined by master pattern circuit or cell locations include not only areas congruent to and superposed over wafer cells 14 but also include areas above the wafer not in registry with or superposed over any one cell or bounded by any cell. For example, such desired positions can include the sites of the relocated signal connects or pads of the pad relocation conductors 20. Although these pad relocation lines are typically straight line segments 0.003 inch wide on 0.004 inch centers extending parallel to rectilinear coordinates, it would be possible to use other configurations and routing. At the sites, signal connect ends of the pad relocation conductors 20 are generally formed into enlarged area pads (FIG. 4).

Figure 3B:
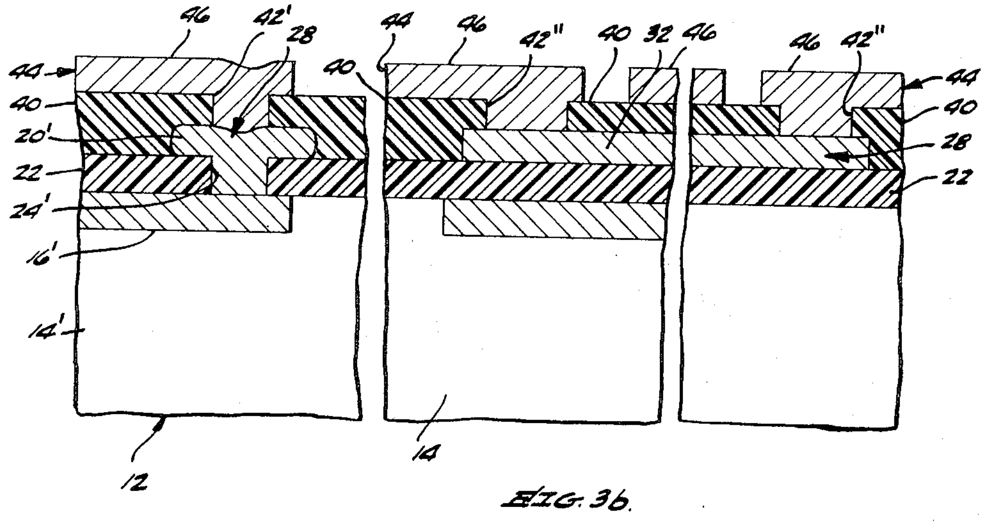

Furthermore, as illustrated in FIG. 3b where a good cell 14 coexists at a desired position defined by a master pattern circuit location, the via 24 formed through the first layer of electrical insulation 22 merely exposes the pad 16 of that good cell without necessarily requiring further relocation routing of pad relocation lines except generally short pad relocation lines 20 such as illustrated in FIG. 3*a* which could, if desired, displace two vias from registry. As a result, the signal connects of all N + K usable cells are effectively routed to desired positions defined by master pattern circuit locations.

In addition to the pad relocation lines 20, the second layer of metalization 28 includes a plurality of crossunder conductor segments 32 (see FIG. 3*b*) located at reserved locations on the face of the first layer of insulation 22. As will be explained in more detail subsequently, some of these cross-unders 32 can cooperate with the standard pattern of interconnect lines in the third layer of metalization illustrated in FIG. 5. As a result, all usable signal connect or logic lines must be brought to the top layer of metalization.

It should also be understood that these individual crossunder conductors 32 and pad relocation lines 20 are also formed in the second layer of metalization 28 such as by a photo process utilizing a mask having pad relocation conductor routing thereon tailored to the yield distribution of each wafer or by a light pen technique. The mask selectively exposes photoresist material on the metal and etching techniques are utilized as described in more detail in my above referenced copending patent application.

A second layer of dielectric insulation 40, such as for example, low sodium glass or quartz, is formed on top of the second layer of metalization 28 with fixed position or standard pattern vias 42 formed at the N + K master pattern circuit locations by a standardized pattern mask common to a plurality of wafers which have usable cells at the same desired positions defined by the same master pattern circuit locations and which are to be fabricated into a specific part type. A portion of these vias 42 expose the terminating ends, signal connect portions, or pads, of pad relocation lines 20 in the second layer of metalization 28 as illustrated in FIG. 3*a*. In addition, some of the vias such as via 42' are superposed over the vias, such as via 24', in the first layer of electrical insulation 22 as illustrated in FIG. 3b so that the pads 16 of the good cell in registry with the desired positions of the cell are exposed to the top layer or third layer of metalization 44. In addition, some vias, such as via 42″, are formed between terminating ends of standard pattern conductors 46 and the selected crossunder conductor segments 32. It should be noted that the crossunders 32 are not otherwise connected with the pads in the first layer of metalization or with pad relocation lines 20 in the second layer of metalization. Thus, as previously stated, all usable signal lines associated with the N + K usable cells are brought to the top layer of metalization 44.

Thereafter, the top layer or third layer of metalization 44 such as, for example, aluminum, is formed on top of the second layer of dielectrical insulation 40 with the terminating ends or portions of the fixed or standard pattern of interconnect lines 46 illustrated in FIG. 5 in registry with the vias 42 in the second layer of insulation 40. As a result, N of the individual master pattern of cells are interconnected into a specified functional circuit which, when electrical signals are applied to the signal input thereof, will operate in a predetermined manner to produce output signals of predetermined characteristics at its output terminals. Furthermore, signal connects or pads associated with the K extra cells are formed in the third layer of metalization at the standard pattern circuit location which were reserved for them. It should be understood that the standard pattern of extra cell signal connects and the interconnect 46 in the top layer of metalization 44 are also formed with a standardized pattern mask common to a plurality of wafers in which the usable cells have effectively been routed to desired positions conforming to master pattern circuit locations and which are to be interconnected into a specific function part type circuit by means of the photoresist technique in combination with etching techniques.

After the top level of metalization 44 has been formed into the interconnects 46 which connect N of the usable cells into a specified functional circuit type, electrical tests are made to determine if the functional circuit type is faulty. Normally this is done by applying d.c. and a.c. signals to the signal connect of the integrated circuits and testing the resultant functional output signals by means of probes. If it is determined that the interconnected circuit is faulty, further d.c. and a.c. tests are made by probe testing various signal test points throughout the top layer of metalization to isolate the fault. Since all of the interconnects associated with all of the N interconnected cells are routed to the top layer of metalization they all can be readily located for the testing of each cell and when the circuit is to be repaired. After the faulty cell or cells (not to exceed K) are located, they are each replaced with one of the K extra cells.

As illustratd in FIG. 6, the complex integrated circuit can be repaired at the top level of metalization by open-circuiting the interconnect lines 46 associated with the faulty one of the N cells as indicated by the dashed line segments (such as 50) to isolate the faulty cell 14 from the remaining ones of the N cells. Thereafter, repair interconnect lines 60 are coupled from the signal connects on pads 16 of one of the K extra cells to the corresponding open-circuited interconnect line 46 associated with the isolated cell whereupon the extra usable cell is interconnected into circuit relationship with the remaining ones of the interconnected N cells.

More specifically, the interconnect lines 46 in the master pattern of the top layer of metalization 44 associated with the pads 16 of the faulty cell 14 are open-circuited at any convenient point between pads 16 and any junction in the interconnect line 46. Such open-circuiting of the interconnect line 46 can be accomplished by cutting the lines with a laser beam which effectively vaporizes the metal, thereby leaving a gap in the interconnect line. Another technique for severing the interconnect line 46 is to use a chemical etching techinque in which photoresist is selectively exposed by means of a mask or by the light pen technique and selectively removed from over the severed segment. Thereafter a chemical etch is applied to remove the metal. It should, of course, be understood that other means can be used for open-circuiting the interconnect lines 46.

Each of the repairing K extra cells 14 is interconnected into functional circuit relationship with the remaining ones of the N interconnected cells by means of connectors such as jumper lines 60 that are bonded to the signal connect or pads 16 of the K extra cells at one end thereof and to the interconnect associated with the corresponding pads 16 of the isolated faulty cell. This connector line 60 can be a jumper wire such as a flying lead of 0.001 inch gold wire which only contacts the top layer metalization at the bonding point to the pad 16 of the extra cell 14 and the corresponding bonding point to the interconnect 46 in the master pattern such as by soldering. It should be noted that the jumper line 60 associated with any pad 16 of the extra cell is bonded to the interconnect line 46 associated with a corresponding pad 16 at a point thereon which is separated from the isolated faulty cell by the severed segment and in electrical contact with the remaining ones of the N cells at any point along the interconnect line 46 that is not interrupted by a circuit element. For example, the interconnects associated with arbitrarily designated signal input pads 16a, 16b, and 16c have the jumpers bonded thereto at the signal input side isolated from pads 16a, 16b, and 16c. Similarly, the jumpers associated with the signal output pad 16d is bonded to the interconnect 46 at a point isolated from the pad 16d of the isolated cell by the severed segment. In some circumstances, such as with the power input pad 16e, the interconnect on both sides of the pad are severed and two jumper leads bonded thereto and thereacross. As a result, the faulty one of the N cells is replaced by a corresponding usable cell in the top layer of metalization.

As previously stated, the advantages of this technique are that all interconnect lines and the connection points of all cells including the K replacement cells are in a fixed pattern for the same part type thus allowing standard replacement procedures to be defined whereupon the signal interconnects associated with each cell are readily identified and located. In addition, since all of the used signal connects associated with the N cell are brought to the top level of metalization before any signal interconnect is accomplished, complete circuit replacement is allowed by disabling fixed lines in the top level only. Furthermore, the standardization and facility of replacement permit engineering compromises to be made in relaxing first level circuit test criteria or tightening final a.c. test criteria or using more complex cells or larger arrays. Still further overall production yield is improved by eliminating the low yield rework step of repairing metalization below the top level.

While salient features have been illustrated and described with respect to a particular embodiment, it should be readily apparent that modifications can be made within the spirit and scope of the invention.

I claim:

1. An integrated circuit interconnection method for interconnecting operable ciruits on an integrated circuit wafer into an electrical function, in which the wafer is provided with a plurality of operable and inoperable circuits, the operable and inoperable circuits having random positions in a non-uniform distribution and having primary signal-connect means associated therewith at a first level of metalization, comprising the steps of:

preparing a master pattern having predetermined circuit locations defining the desired positions of operable circuits on the wafer to be subjected to masking processes utilizing standardized mask means common to all wafers to be similarly processed into the electrical function;

testing the plurality of operable and inoperable circuits to determine actual positions of operable and inoperable circuits;

comparing the actual positions of the tested operable circuits to the desired positions as determined by the master pattern;

selecting operable circuits from any of the tested operable circuits irrespective of their position and distribution on the wafer, the number of selected operable circuits exceeding the number of operable circuits required to perform the electrical function, the number of selected operable circuits including a first group equalling the number of the predetermined circuit locations and a second group for use as additional repair circuits for any subsequently tested malfunctioning circuits of the first group;

electrically coupling the primary signal-connect means of each of the first group of the selected operable circuits, including those first group operable circuits whose actual positions do not correspond to their desired positions, to sites of secondary signal-connect means situated at the desired positions, whereby each of the first group of the selected operable circuits are terminated in the secondary signal-connect means and in the desired positions corresponding to the predetermined circuit locations of the master pattern;

electrically coupling the secondary signal connect means by use of the masking processes and the strandardized mask means to interconnect at a subsequent metallization level the first group of the selected operable circuits into an interconnection scheme, whereby the circuits in the wafer may be connected into the electrical function by use of the standardized mask means regardless of their actual positions on the wafer;

electrically coupling the primary signal-connect means of each of the second group of the selected operable circuits to the subsequent metallization level;

testing the first group of the selected operable circuits at the subsequent metallization level and electrically isolating any malfunctioning ones of the first group of the selected operable circuits; and electrically coupling any of the second group of the operable circuits previously brought to the subsequent metallization level in place of the malfunctioning ones of the first group.

2. The method of claim 1 wherein said first-mentioned routing step further comprises the steps of:

electrically isolating each of the inoperable circuits, including each of the inoperable circuits coinciding with any ones of the desired positions defined by the predetermined circuit locations and electrically isolating each of the unselected operable circuits;

exposing the primary signal-connect means of each of the first group of the selected operable circuits by masking and insulation material removal means; and routing electrical conduction means from the exposed primary signal-connect means to the sites of the secondary signal-connect means, whereby some of the secondary signal-connect means at the sites of secondary signal-connect means are situated over or near a corresponding number of the inoperable circuits in electrical isolation therefrom.

3. The method of claim 1 for use with a plurality of the wafers wherein the master pattern is identical for all the wafers, and electrically coupling the primary signal-connect means of each of the first group of the selected operable circuits of each of the wafers to the sites of the secondary signal-connect means.

4. The method of claim 1 wherein said first-mentioned coupling step comprises the steps of:

forming a first layer of photoresist material over the first level of metallization;

exposing to light portions of the first photoresist layer overlaying the primary signal-connect means of the selected operable circuits through masking means to form exposed portions and unexposed portions of the first photoresist layer, the exposed portions overlaying the primary signal-connect means of the selected operable circuits;

removing the unexposed portions of the first photoresist layer;

forming a layer of electrically insulating material over the circuits and the exposed photoresist portions of the first layer;

heating the device to crack the insulating material over the first exposed photoresist portions;

removing the first layer exposed photoresist portions and the cracked insulating material to expose the primary signal-connect means of the selected circuits through the thus formed feedthrough means in the insulating material;

forming a layer of electrically conductive material on the insulating material and the exposed primary signal-connect means;

forming a second layer of photoresist material on the layer of electrically conductive material;

exposing portions of the second photoresist layer in a pattern of interconnect lines extending from the exposed primary signal-connect means to the sites of the secondary signal-connect means to form exposed and unexposed portions of the second photoresist layer;

removing the second layer unexposed photoresist portions to expose portions of the conductive material;

removing the exposed portions of the conductive material; and removing the exposed photoresist portions, leaving the conductive material in the pattern of interconnect lines, extending from the primary signal-connect means of the selected operable circuits to the sites of the secondary signal-connect means.

5. An integrated circuit interconnection method for use with a plurality of integrated circuit wafers, each capable of performing the same electrical function, each of the wafers having a plurality of operable and inoperable circuits in random positions of a non-uniform distribution, each of the circuits having primary signal-connect means associated therewith in a first level of metallization, comprising the steps of:

preparing a master pattern having predetermined circuit locations identical for each and every one of the wafers, the predetermined circuit locations defining desired identical positions of operable circuits to be subjected to masking processes utilizing standardized mask means, the number of the desired positions of operable circuits exceeding the number of the operable circuits required to perform the electrical function;

testing the plurality of operable and inoperable circuits of each of the wafers to determine actual positions of operable circuits on each of the wafers;

for each of the wafers, comparing the actual positions of the tested operable circuits to the desired positions as determined by the master pattern;

for each of the wafers, selecting operable circuits from any of the tested operable circuits irrespective of their position and distribution on individual ones of the wafers, the number of the selected operable circuits exceeding the number of operable circuits required to perform the electrical function;

for each of the wafers, electrically insulating the operable and inoperable circuits and the primary signal-connect means from one another to form a first insulation layer over the primary signal-connect means, with feedthrough means in the first insulation layer opening to the primary signal-connect means of the selected operable circuits;

for each of the wafers, electrically routing the primary signal-connect means of each of the selected operable circuits, including those operable circuits whose actual positions do not correspond to their desired positions, through the feedthrough means to sites of the secondary signal-connect means of each of the selected operable circuits and thereby terminating a number of the selected operable circuits in the desired identical positions sufficient in number corresponding to the predetermined circuit locations of the master pattern;

further electrically routing and interconnecting the secondary signal-connect means on individual ones of the wafers to positions of further signal-connect means to integrate individual ones of the wafers into an interconnection scheme capable of performing the same electrical function by the masking processes and standardized mask means;

testing the plurality of selected circuits of each of the wafers to identify malfunctioning selected operable circuits or routings after any of the electrically routing steps;

electrically coupling the secondary signal-connect means or the further signal-connect means to the primary signal-connect means of any others of the operable circuits not previously utilized in the interconnection scheme in place of malfunctioning ones of the selected operable circuits and the coupling means; and electrically isolating the malfunctioning ones of the selected operable circuits and their routings, and the remaining ones of the selected operable circuits in excess of the number of the operable circuits required to perform the electrical function.

6. A method as in claim 1 further including the step of forming the master pattern of the predetermined circuit locations for the first group in accordance with the expected density of the selected operable circuits for all the wafers.

7. A method of repairing a multi-level complex integrated circuit of the type including a wafer having a plurality of cells thereon, each cell having signal connects associated therewith in a layer of metaliztion on the wafer surface, comprising the steps of:

predetermining cell locations in a master pattern to define desired positions of usable cells to be processed by standardized masking means having standard opening means therein;

testing the cells to determine actual positions of usable cells;

comparing the actual positions of the usable cells to the desired positions defined by the cell locations;

electrically routing the signal connects of N usable cells in a group of N + K (where N and K are integers) usable cells to the desired positions defined by the master pattern and common to all wafers to be similarly processed in a subsequent layer of metalization;

electrically interconnecting the signal connects of the N cells at the desired positions by the standardized masking means into a functional circuit type at a further layer of metalization subsequent to the first-mentioned layer of metalization and forming signal connects for K of the usable cells at the further layer of metalization;

electrically testing the functions of the interconnected N cells for faulty ones of the N cells;

electrically isolating the faulty ones of the N cells from the remaining N cells by open-circuiting the signal interconnects in the further layer of metalization associated with faulty ones of the N cells; and interconnecting the signal connects of corresponding ones of the K cells to the open-circuited signal interconnects associated with the isolated N cells to interconnect the corresponding ones of the K cells into circuit relationship with the remaining ones of the interconnected N cells.

8. The method of claim 7 further comprising the step of routing all usable signal connects associated with the N + K cells to the top level of metalization through vias in a layer of insulation.

9. The method of claim 7 further comprising the steps of routing the second layer of metalization in the master pattern of conductors that is common to a plurality of wafers having a non-standard yield pattern and routing the signal connects of usable cells to desired positions defined by the locations.

* * * * *